(12) United States Patent
Laack et al.

(10) Patent No.: US 10,460,684 B2
(45) Date of Patent: Oct. 29, 2019

(54) DISPLAY DEVICE

(71) Applicant: Visteon Global Technologies, Inc., Van Buren Township, MI (US)

(72) Inventors: Alexander Van Laack, Aachen (DE); Ruddy Cittadini, Cologne (DE); Frederik Belzl, Cologne (DE)

(73) Assignee: Visteon Global Technologies, INC., Van Buren Township, MI (US)

( * ) Notice: Subject to any disclaimer, the term of this patent is extended or adjusted under 35 U.S.C. 154(b) by 0 days.

(21) Appl. No.: 15/890,731

(22) Filed: Feb. 7, 2018

(65) Prior Publication Data

US 2018/0226036 A1    Aug. 9, 2018

(51) Int. Cl.

| G09G 3/36 | (2006.01) |
| G09G 3/3225 | (2016.01) |
| G02F 1/1362 | (2006.01) |
| G06F 1/16 | (2006.01) |
| H01L 27/32 | (2006.01) |
| G02F 1/1333 | (2006.01) |
| G02B 6/00 | (2006.01) |
| H01L 51/00 | (2006.01) |
| G02F 1/1347 | (2006.01) |

(52) U.S. Cl.
CPC ............. *G09G 3/3648* (2013.01); *G02B 6/00* (2013.01); *G02F 1/133308* (2013.01); *G02F 1/136209* (2013.01); *G06F 1/1607* (2013.01); *G09G 3/3225* (2013.01); *H01L 27/322* (2013.01); *H01L 27/3244* (2013.01); *G02F 1/1347* (2013.01); *G02F 2001/13332* (2013.01); *G02F 2001/133331* (2013.01); *G02F 2001/133388* (2013.01); *G02F 2201/44* (2013.01); *G02F 2203/48* (2013.01); *G06F 2200/1612* (2013.01); *H01L 51/0076* (2013.01)

(58) Field of Classification Search
CPC ............ H01L 27/3241; H01L 27/3281; G09G 3/3225; G09G 3/3648; G09G 2300/02; G09G 2300/023; G02F 1/136209
See application file for complete search history.

(56) References Cited

U.S. PATENT DOCUMENTS

| 6,317,037 | B1 | 11/2001 | Ayres et al. |
| 2007/0032000 | A1* | 2/2007 | Yeh .................. G02F 1/133555 438/149 |
| 2009/0295731 | A1* | 12/2009 | Kim ...................... G06F 1/1616 345/168 |
| 2010/0020265 | A1* | 1/2010 | Senoue ............... G02F 1/13362 349/62 |
| 2015/0153615 | A1 | 6/2015 | Ji et al. |

FOREIGN PATENT DOCUMENTS

| DE | 60300104 T2 | 3/2005 |
| DE | 102005026872 A1 | 12/2006 |
| DE | 102008037061 A1 | 2/2010 |

(Continued)

*Primary Examiner* — Ermias T Woldegeorgis
(74) *Attorney, Agent, or Firm* — Quinn IP Law

(57) ABSTRACT

The disclosure, which relates to a display device is created so that it can be integrated in a surface, providing in particular a seamless extension and an integrated appearance between the surface surrounding the display device and the display device itself and thus appears to the viewer of the display device as being part of a surface.

19 Claims, 3 Drawing Sheets

(56) References Cited

FOREIGN PATENT DOCUMENTS

| | | |
|---|---|---|
| DE | 102009048682 A1 | 4/2011 |
| EP | 0648639 A1 | 4/1995 |
| EP | 1342605 A1 | 9/2003 |
| EP | 1462297 A2 | 9/2004 |
| FR | 2727559 A1 | 5/1996 |
| FR | 2957860 A1 | 9/2011 |
| JP | 2004233701 A | 8/2004 |
| JP | 2011527773 A | 11/2011 |
| JP | 2012242465 A | 12/2012 |

\* cited by examiner

DISPLAY DEVICE

CROSS-REFERENCE TO RELATED APPLICATION

This application claims priority to German Patent Application No. 10 2017 102 321.6, filed Feb. 7, 2017, and entitled "DISPLAY DEVICE," which is herein incorporated by reference.

BACKGROUND

The disclosure relates to a display device with a display for the representation of information and a cover surface arranged on the display.

In many fields of technology displays are used for the representation or indication of information in many different designs. As examples, one could mention devices and systems such as hi-fi appliances, computers, household appliances or machines and layouts in production facilities. Generally these displays are arranged in so-called display devices, which besides the actual display also comprise, for example, means of positioning or holding, protecting, and actuating of the display.

The use of such display devices in vehicles is likewise known, for example, in order to indicate to the driver information about an operating state of the vehicle, such as a speed, an engine speed, an engine temperature, a gas tank level. Furthermore, supplemental information on components in the vehicle may also be represented, such as a sound system, an air conditioning system or a navigation system, and many others.

Besides the pure representation of information, the design of a display or a display device is becoming increasingly important, Original equipment manufacturers are striving, for example, to adapt a display installed in a vehicle to the vehicle design or integrate it therein, for example by having the display appear transparent or invisible on a surface.

By an original equipment manufacturer (PEW is meant here a manufacturer of components or products which it produces at its own factories, but usually does not market its products in the retail trade, except for a few manufacturers in the automotive industry.

One known design for the display devices used in vehicle cockpits is a display appearing dark or black with a so-called black panel effect.

However, vehicle makers and original equipment manufacturers are striving to display information everywhere in the vehicle, for example, on any given surfaces. The display devices required for this should give the impression that information appears or is displayed simply on the surface of a plane which may be situated in any given region of the dashboard or other areas of a vehicle The displays used in the prior art cannot meet these requirements. Therefore, for example, a display device integrated in a decorative surface is usually distinctly visible as a display device and does not appear to be integrated, since the display device stands out distinctly by the display and/or the frame from its surroundings. Therefore, a seamless transition between a display device and the surroundings is desirable.

There is known from US2004041504 an electronic display without a frame. This display comprises an electronic indicator device, containing an image display section and another section outside of the image display section; a flat cover, which contains a first section that is transparent to light and a second section outside of the first section; and a housing, which contains an open end, Wherein the electronic indicator device is mounted in the housing and the cover closes the open end of the housing without a frame.

Furthermore, it is disclosed that the first section of the cover covers the image display section of the indicator device, that the second section of the cover covers the further section of the indicator device, and that the first and the second section of the cover contain optical properties which are chosen such as to present an appearance of a uniform covering without a frame when the indicator device is not showing any image or is darkened. Furthermore, the optical properties of the first section are likewise selected in regard to the transparency to images which are indicated on the image display section of the electronic indicator device. The second section of the cover has optical properties which are different from the first section, the optical properties of the second section being chosen such that the second section of the cover masks the other section of the indicator device and gives the appearance of a nontransparent, darkened border.

From EP2618200 B1 there is known a display panel with a first substrate, a second substrate facing the first substrate, and a plurality of partition walls arranged on the second substrate and a defining a plurality of sub-pixels.

Furthermore, it is disclosed that the display panel comprises a nontransparent insulation layer, which is arranged on the second substrate, wherein the nontransparent insulation layer comprises a dielectric layer and nontransparent liquid elements that are arranged on the dielectric layer. The display panel also has a plurality of colored liquid elements, corresponding to each of the individual sub-pixels and arranged between the nontransparent insulation layer and the first substrate, wherein the colored liquid elements are an electrically conductive or a polar light-transparent colored solution, and a plurality of pixel electrodes is provided, corresponding to each of the individual sub-pixels and arranged between the second substrate and the nontransparent insulation layer.

Furthermore, it is provided that the pixel electrodes are black and nontransparent, while the transparent insulation layer comprises a transparent dielectric layer, which is arranged on the second substrate, and white nontransparent liquid elements, corresponding to each of the individual sub-pixels and arranged on the transparent dielectric layer, wherein the colored liquid elements and the white transparent liquid elements are immiscible in the individual sub-pixels; or the pixel electrodes are white and nontransparent, while the nontransparent insulation layer comprises a transparent dielectric layer, which is arranged on the second substrate, and black nontransparent liquid elements, corresponding to each of the individual sub-pixels and arranged on the transparent dielectric layer, while the black nontransparent liquid elements and the colored liquid elements are immiscible.

W003067014 discloses a window element, comprising at least one platelike and at least partly transparent element with at least one surface (display) designed for image reproduction, being part of the platelike element, wherein a first state is provided with the display turned on and in a second state with the display turned off it is possible to see at least partly through the platelike element, wherein the platelike element comprises at least one projector-independent image-producing display and in the first state with the display turned on image elements are created in the display and these image elements are represented on the platelike element. It is provided here that light-emitting diodes are used for the display.

Furthermore, it is provided to employ in particular a time and/or color control of the light-producing means and to provide an intermediate layer which can be a itched from a transparent state to a nontransparent or mirror-reflecting state.

From DE102013021330 there is known an illuminated indicator device for an electrical control element, especially for an electrical control element in the interior of a motor vehicle, wherein the indicator device comprises a display area facing the operator and a display region is formed herein for the displaying of various icons, having for this purpose several icon mask and at least one light source, wherein each icon displayed is assigned to an icon mask and a light source, and each icon mask has a projection region which is designed to project the light impinging on this region into the display region as the icon being displayed.

Furthermore, it is provided that, in order to display the icon, light from the light source coordinated with the icon can be coupled laterally into the icon mask associated with the icon being displayed and can be conducted within the icon mask to the projection region of this icon mask, while the indicator device is designed such that the icon mask at first works as a light channel and reflects the light coupled into the icon mask from the side within the icon mask until the light impinges on the projection region of the icon mask and is projected there by means of this projection region into the display region for the displaying of the icon.

It is furthermore disclosed that there is arranged above at least one icon mask, preferably above each icon mask, a layer which is at least partly nontransparent and which covers the icon mask at least partly, the layer being in particular designed so that the layer is nontransparent outside the projection region of the icon mask and transparent in the area of the projection region of the icon mask.

Thus, in the prior art there is no display device which can be integrated in a surface and which enables an adaptation to the surface or the surroundings such that a seamless transition is achieved between the display device and the surroundings. Furthermore, there is no known solution which houses the display device, even in a switched-off state, so that the display device is not noticeable in the surface where it is integrated.

SUMMARY

The problem which the disclosure proposes to solve is to create a display device which can be integrated in a surface and which overcomes the drawbacks of the prior art. In particular, a seamless extension and an integrated appearance should be provided between the surface surrounding the display device and the display device itself, To the viewer, the display device in the switched-off state should appear as part of the surface, while the display device in the switched-on state should provide a seamless optical transition between the display device itself and the surface.

The present specification shows one way of creating an ambient light effect in a display device or around a display. The purpose of the ambient light effect is to illuminate the display device in its border areas, i.e., around the actual display proper, in a color and brightness suited to the background or the surface surrounding the display. Thus, the display device appears to be integrated in the surroundings or the background and is not distinguished by a visible border or frame. The display device thus appears to be seamlessly integrated into any given surface.

Thus, the possibility exists for an integration in any given regions in a vehicle, such as a dashboard or similar areas of a vehicle having an approximately level surface.

The display device according to the disclosure comprises a usual display for the representation of various information, such as an OLED (organic light emitting diode) display or an LCD display, through not being limited to these forms of displays.

It is provided that an electrical tint film and a cover surface are arranged above the surface of such a display.

The electrical tint film is chosen in the color in which the display device according to the disclosure should appear in its in currentless or switched-off state. In the example, a white electrical tint film is used in order to provide a display device appearing white.

The electrical tint film appears, when no voltage is applied, in a white tint and is nontransparent, so that a viewer of the display device cannot see the display situated beneath the electrical tint film.

In this way, a display device is optimally integrated in a white surface, for example, and can hardly be noticed by a viewer. Thus, by a suitable choice of the color of the electrical tint film, the display device in the switched-off state can be adapted, for example, to the surface of a dashboard in a vehicle.

If an appropriate voltage is applied to the electrical tint film, the optical properties of the tint film are altered and it becomes transparent. In this state, a viewer can discern information on the display through the cover surface and the tint film. The display device and the display become visible to the viewer within the surface.

In one special embodiment of the display device it is provided that the cover surface is configured such that its optical properties change, starting from the midpoint of the cover surface, toward the border, Thus, a border area is provided around the cover surface, which appears to be nontransparent and for example white.

This white appearing border area of the cover surface interacts with the white electrical tint film and improves the overall white impression of the display device. Thus, a typical contrast or optical difference between a surface in which the display device is arranged and the display device itself is practically eliminated.

One special advantage of the disclosure is that the specified display device can make use of standard displays available on the market, usually appearing dark or black in the switched-off state, such as TFT, LCD or OLED displays, Thus, the display device according to the disclosure is very flexible in configuration and can be produced economically.

The display device according to the disclosure is provided with an electrical tint film, making it possible to allow viewing a display situated beneath the tint film when a voltage is applied, or to prevent a viewing when no voltage is applied. Thus, with the use of different customary displays presenting a dark or black view in the switched-off state, a display device can be provided in the color of the electrical tint film, such as white In order to protect the electrical tint film, it is provided to arrange a cover surface (glass layer) on top of it. In one advantageous modification, this cover surface is transparent in the middle and configured with an encircling nontransparent border area. It is provided that the degree of coloration of the border area increases toward the outside and is adapted to the surface surrounding the display device.

For the connecting of different surfaces, such as that of the display to that of the electrical tint film and/or the surface of the electrical tint film to the cover surface, an optical bonding method is advantageously used. This method can also involve the surface of a diffusion disk.

In optical bonding, in which an optical unit can be created as a stack, a space between the components of the display device is filled for example with a compound adapted in terms of the index of refraction in order to connect the components to each other. This air-free filling of the intermediate space makes it possible to manufacture displays with good optical properties and an improved contrast ratio.

In order to lessen the optical differences between a surface and a display arranged in this surface, a diffusion disk is arranged for example in a region around the display, which is provided with a background lighting.

Such a background lighting can be provided, for example, by means of one or more light sources such as LEDs.

It is especially advantageous to create different brightness regions in the diffusion disk, for example by means of several light sources. In this way, an almost continual brightness transition can be created, from the brightly lit display to the surrounding unlit surface, so that the display device appears integrated in the surface.

Alternatively, a light diffuser with at least one attached or integrated light source can be used, which provides different brightnesses in different regions of the light diffuser, so that the region immediately around the display seems brighter than the region next to the surrounding surface. Also in this way a gentle transition is achieved between the lit display and the surrounding unlit surface.

BRIEF DESCRIPTION OF DRAWINGS

Further details, features and benefits of embodiments of the disclosure will emerge from the following description of sample embodiments with reference to the corresponding drawings.

DETAILED DESCRIPTION

Figure 1:
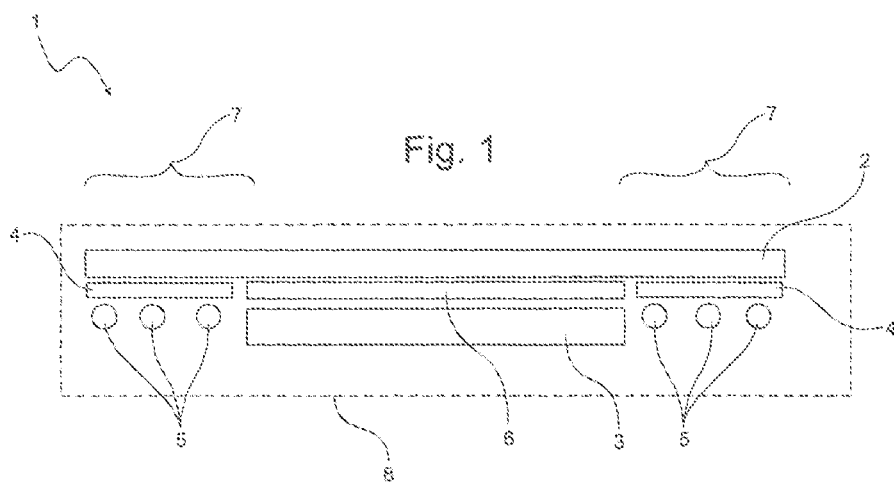
FIG. 1: a schematic of a display device according to the disclosure in a side view.

FIG. 1 shows the schematic of the display device 1 according to the disclosure in a side representation. Beneath a cover surface 2, which is arranged facing a viewer, not shown, and which is substantially transparent, there is arranged a display 3. Such a display 3 may be designed, for example, as an organic light emitting diode (OLED) or a similar display. For the actuating of the display 3, a corresponding wiring as well as a control arrangement is provided, not being shown in FIG. 1.

Between the display 3 and the cover surface 2 there is arranged an electrical tint film 6. This tint film 6 has the property of appearing in a color, such as a white color, in a currentless state, i.e., with no outside voltage applied to it. If a voltage is applied to this tint film 6, the appearance changes, for example from white to a transparent state of the electrical tint film 6. In order to provide the voltage needed for the electrical tint film 6, a usual arrangement from the prior art for the providing of an output voltage can be used. The controlling of this arrangement can be done by the central control arrangement which also controls the display 3 and is not part of this disclosure.

Such electrical tint films 6 have at least one layer in their makeup which, under the influence of an electrical voltage or the action of an electrical field, changes for example the orientation of its components, such as liquid crystals (liquid crystal molecules) and thus scatters or deflects the light rays impinging on the film in the currentless state and lets them pass when a voltage is applied.

Beneath the electrical tint film 6 is arranged a display 3 known in the prior art for the indication or representation of any desired information. This display 3 may be a liquid crystal display (LCD), a thin-film transistor (TFT) display, an organic light emitting diode (OLE) display, or another suitable display for the indication of information.

In a switched-off state, the display device 1 in the event that a white electrical tint film 6 is arranged will appear in a white design. If a different color such as blue is used for the electrical tint film 6, the display device 1 in the switched-off state will appear in a blue design. If information is presented for indication on the display 3, this will not be discernible to a viewer through the white or blue opaque electrical tint film 6.

If a voltage is applied to the electrical tint film 6, the film 6 changes its properties from nontransparent to transparent in this state, the display 3 arranged underneath the tint film 6 and the information presented on it are well discernible to a viewer.

In one special embodiment of the present disclosure, it is provided that the cover surface 2, also known as the "glass layer", is designed such that its optical properties change from the midpoint of the cover surface 2 outward to the border of the cover surface 2. While the transparency of the cover surface 2 is best at the midpoint, it diminishes increasingly in the direction of the border of the cover surface 2 and passes for example into an increasingly white tint, Since the cover surface 2 has little or no tint in the central region of the display 3, the perception of information represented on the display 3 is not affected.

Thanks to this change in the optical properties of the cover surface 2, a border area 7 with an increasing coloration of the cover surface 2 is formed, which appears for example white and almost nontransparent. Depending on the organization of the change in the optical properties, a border area 7 can be formed which is elliptical or rectangular in shape, it being provided that the coloration 7 does not impair the visibility of the information presented on the display 3. This can be ensured, for example, by forming the coloration 7 in a region into which the display 3 no longer extends by its dimensions.

This change in the optical properties of the cover surface 2 along an imaginary distance extending from the middle of the cover surface 2 may be linear or nonlinear, Different stretches extending in starlike pattern from the center may also have different changes in their optical properties. It is advantageous to select these gradients so that the coloration 7 forms an ellipse or ideally almost a rectangle, the transparent region being chosen to be not larger than the dimensions of the display 3 located underneath. In particular, the coloration 7 may have several different-sized ellipses or rectangles, each with a different degree of coloration 7, the degree of coloration 7 increasing toward the outside This property may be employed with special advantage in the case when the electrical tint film 6 and possibly also the display 3 are smaller in their dimensions than the cover surface 2, as is shown in FIG. 1.

This linear or nonlinear change in the optical properties of the cover surface 2 is provided in such a way that the display device 1 is perceived, for example in a white tint, even outside the dimensions of the tint film 6. On the other hand, the change in the optical properties in the region of the display 3 is organized such that the display 3 can shine sufficiently through the cover surface 2 for a qualitatively sufficient representation.

In the regions not covered by the display 3, there is provided an arrangement of a diffusion disk 4 as a light diffuser. This arrangement of one or more diffusion disks 4 is done, for example, so that one diffusion disk 4 is arranged on two opposite sides of the display 3.

In an alternative embodiment of a display device 1 it is provided that the display 3 is surrounded by four diffusion disks 4 on four sides. For this case, it is advantageous to select a design of a diffusion disk 4 in the form of a frame surrounding the display 3. In this way, a single-piece design of the diffusion disk 4 can be used in place of four individual diffusion disks 4.

With this single-piece design of the diffusion disk 4, the best possible integration of the display device 1 in a surface, for example that of a dashboard, is achieved.

In order to design this integration of the display device 1 in a surface with an optically gentle transition between the display 3 and the surrounding surface, at least one light source 5 is arranged as a background lighting in the regions in which the single piece diffusion disk 4 is arranged, behind this diffusion disk 4.

For such a background lighting it is possible to use light sources 5 such as light-emitting diodes (LED). The arrangement of the light sources 5 may also be for example in the form of a matrix with several rows and several columns.

By means of such a matrix-formed arrangement of the light sources 5 behind the diffusion disk or disks 4, the transition between the display 3 and the surrounding surface can be organized advantageously. This arrangement makes it possible to control the light produced by the light sources 5 in various brightnesses. Thus, for example, it is possible to operate light sources 5 which are arranged immediately next to the display 3 with a greater brightness than light sources 5 which are further away from the display 3 and thus closer to the surface surrounding the display device 1. By means of a suitable activation, a suitable bright to dark transition can thus be established in the region between the display 3 and the surrounding surface.

In one particular embodiment it is provided that the brightness of the light sources 5 is adapted to the brightness of the display 3. So that the region of the diffusion disk 4 surrounding the display 3 for example on all four sides does not appear brighter than the indication on the display 3, an adapting of the maximum brightness of the light sources 5 to the maximum brightness of the display 3 is done, in this way, the gentle optical transition between the display 3 and the surrounding surface is improved.

It is advantageous for the described structure of the display device 1, consisting of the cover surface 2, the display 3, the diffusion disk or disks 4, the electrical tint film 6 and the light sources 5, to be joined into a mechanically stable display device 1 by an optical bonding. This optically bonded unit 8 is represented in FIG. 1 by means of a dash-dash line. Such an optically bonded unit 8 is also known as a stack.

Figure 2:
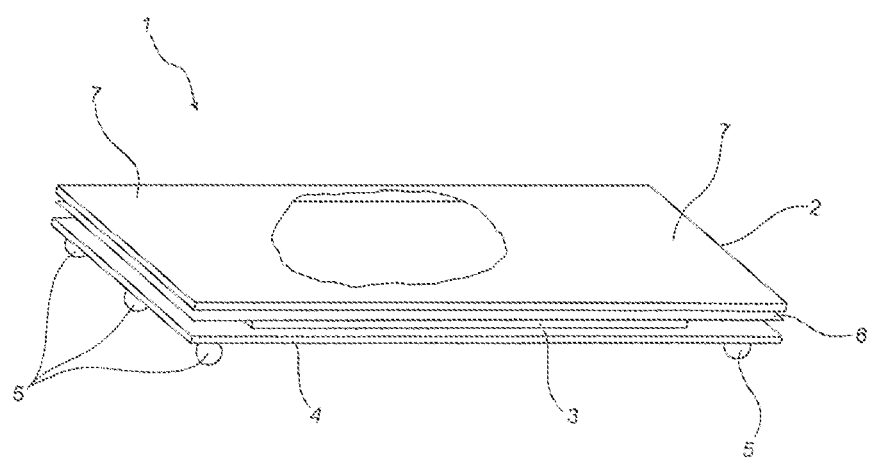
FIG. 2: a schematic of the display device according to the disclosure in a perspective representation in a state with hidden display.

FIG. 2 shows a schematic of the display device according to the disclosure in a perspective representation, in a state with hidden display 3, The representation of FIG. 2 shows a stack-like structure, comprising a cover surface 2 turned toward the viewer, an electrical tint film 6 arranged beneath this cover surface 2, and a display 3. The electrical tint film 6 extends in this embodiment, by contrast with the representation in FIG. 1, over the entire region of the cover surface 2. Alternatively, of course, a different extension of the electrical tint film 6 to only the region of the display 3 is possible.

The background lighting of the display device 1 is realized by a diffusion disk 4, likewise extending across the region of the cover surface 2, and light sources 5 arranged behind the diffusion disk 4.

Alternatively, a background lighting may also be provided by means of several lightguide elements, not shown, and several light sources 5, arranged for example in the border area of the display device 1, which are connected to the lightguide elements.

In FIG. 2 one can also see the coloration 7 of the cover surface 2 occurring or increasing in the border areas of the cover surface 2, which provides to the viewer a unified impression between the display device 1 and the surrounding surface of the display device 1.

It is especially advantageous to integrate the display device 1 for example in a region of the dashboard. When no representation of information is occurring on the display 3, an optical adaptation of the display device 1 and the surrounding surface is achieved in that the electrical tint film 6 is selected in a color matched to the surrounding surface. For example, if the surface of the dashboard surrounding the display device 1 has a white tint, an electrical tint film 6 with a white color will be used. If no representation of information is occurring on the display 3 of the display device 1, the electrical tint film 6 will be operated without a voltage applied and appears white.

On the other hand, if a representation of information is occurring on the display 3 of the display device 1, a transparent state of the electrical tint film 6 is achieved by applying an appropriate voltage. At the same time, a lighting of the display 3 and especially the regions of the diffusion disk 4 surrounding the display 3 is accomplished by means of one or more light sources 5, achieving a gradual or uniform transition of the lighting intensity between the display 3 and the unlit surface surrounding the display device 1 attuned to the maximum display brightness. When the representation of information on the display 3 is over, the voltage will be switched off from the electrical tint film 6 and from the light sources 5 and the display device 1 appears in a white tint in which it is no longer distinguished from the surrounding surface. The viewer perceives a uniformly white surface, from which the display device 1 is not distinguished, Since the display device 1 is hardly perceived by the viewer, information when the display 3 is switched on and voltage is applied to the electrical tint film 6 appears as if represented on the surface of the dashboard.

Figure 3:
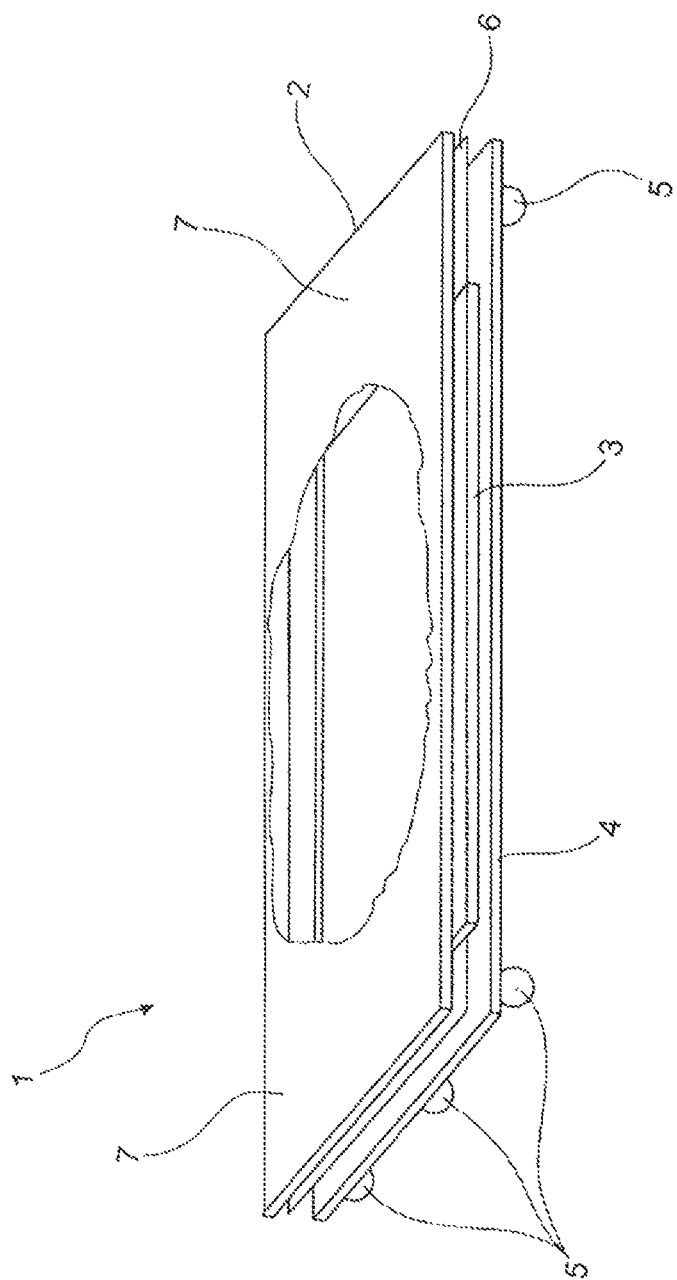
FIG. 3: a representation of the display device of FIG. 2 in a state with visible display.

While FIG. 2 shows the state of the hidden display 3 by means of a currentless electrical tint film 6, FIG. 3 shows the display device 1 in a state with voltage applied to the electrical tint film 6 and a display 3 visible to the viewer. The additional representation of sample information is not shown in FIG. 3. Thus, only the display 3 visible beneath the electrical tint film 6 is shown in FIG. 3.

What is claimed:

1. A display device, comprising:
  a light emitting display;
  a light source;
  an electrical tint film;
  a diffusion disk; and
  a cover surface arranged on the light emitting display,
    wherein between the light emitting display and the cover surface there is arranged the electrical tint film,
    wherein in an area around the light emitting display there is arranged the diffusion disk, wherein the light source is disposed adjacent the diffusion disk, and wherein the cover surface is formed with a coloration, wherein an intensity of the coloration increases from a middle, central region of the cover surfaces to border areas of the cover surface.

2. The display device as claimed in claim 1, wherein the coloration of the cover surface has the shape of a rectangle.

3. The display device as claimed in claim 1, wherein the coloration of the cover surface has the shape of an ellipse.

4. The display device as claimed in claim 1, wherein the electrical tint film is arranged over the entire area of the cover surface on the side of the cover surface facing away from a viewer of the display device.

5. The display device as claimed in claim 1, wherein the light emitting display is defined as a TFT.

6. The display device as claimed in claim 1, wherein the light emitting display is defined as a LCD.

7. The display device as claimed in claim 1, wherein the light emitting display is defined as an OLED display.

8. The display device as claimed in claim 1, wherein the light emitting display is defined as a LED display.

9. The display device as claimed in claim 1, wherein the light sources is arranged behind the diffusion disk in the form of a matrix with several rows and columns.

10. The display device as claimed in claim 1, wherein the light emitting display, the cover surface, the light source, and the diffusion disk are optically bonded with each other.

11. A display device, comprising:
a light emitting display;
a cover surface arranged on the light emitting display,
an electrical tint film having at least one layer arranged between the light emitting display and the cover surface;
a diffusion disk arranged around the light emitting display; and
at least one light source disposed adjacent the diffusion disk,
wherein the cover surface is formed with a coloration, wherein an intensity of the coloration increases from a middle, central region of the cover surfaces to border areas of the cover surface.

12. The display device as claimed in claim 11, wherein an appearance of the at least one layer of the electrical tint film is changed in response to the application of an electrical field.

13. The display device as claimed in claim 12, wherein the appearance of the at least one layer of the electrical tint film is changed from a nontransparent state to a transparent state in response to the application of the electrical field.

14. The display device as claimed in claim 11, wherein the electrical tint film is arranged over the entire area of the cover surface on the side of the cover surface facing away from a viewer of the display device.

15. The display device as claimed in claim 11, wherein the coloration of the cover surface is formed in a shape, wherein the shape is selected from the group consisting of a rectangle and an ellipse.

16. The display device as claimed in claim 11, wherein the light emitting display is selected from the group consisting of a TFT, a LCD, an OLED display and a LED display.

17. A display device, comprising:
a light emitting display;
a cover surface arranged on the light emitting display,
an electrical tint film having at least one layer arranged between the light emitting display and the cover surface, wherein an appearance of the at least one layer of the electrical tint film is changed in response to the application of an electrical field;
one or more diffusion disks arranged around the light emitting display, wherein the one or more diffusion disks cooperate to form a frame arranged around the light emitting display; and
at least one light source disposed adjacent each of the one or more diffusion disks, wherein the at least one light source is arranged in a matrix with several rows and columns behind each of the one or more diffusion disks,
wherein the cover surface is formed with a coloration, wherein an intensity of the coloration increases from a middle, central region of the cover surfaces to border areas of the cover surface.

18. The display device as claimed in claim 17, wherein the appearance of the at least one layer of the electrical tint film is changed from a nontransparent state to a transparent state in response to the application of the electrical field.

19. The display device as claimed in claim 17, wherein the coloration of the cover surface is formed in a shape, wherein the shape is selected from the group consisting of a rectangle and an ellipse.

* * * * *